United States Patent
Wu

(10) Patent No.: US 6,649,481 B2
(45) Date of Patent: Nov. 18, 2003

(54) METHODS OF FABRICATING A SEMICONDUCTOR DEVICE STRUCTURE FOR MANUFACTURING HIGH-DENSITY AND HIGH-PERFORMANCE INTEGRATED-CIRCUITS

(75) Inventor: Ching-Yuan Wu, Hsinchu (TW)

(73) Assignee: Silicon-Based Technology Corp., Hsinchu (TW)

(*) Notice: Subject to any disclaimer, the term of this patent is extended or adjusted under 35 U.S.C. 154(b) by 135 days.

(21) Appl. No.: 09/820,903

(22) Filed: Mar. 30, 2001

(65) Prior Publication Data

US 2002/0142552 A1 Oct. 3, 2002

(51) Int. Cl.[7] .............................................. H01L 21/336
(52) U.S. Cl. ........................ 438/301; 438/201; 438/221; 438/222; 438/226; 438/231; 438/296; 438/298; 438/300; 438/301; 438/418; 438/425
(58) Field of Search ................................ 438/151, 154, 438/157, 163, 197, 199, 201, 211, 218, 221, 223, 225, 257, 296, 297, 298, 407, 404, 424, 425, 427, 433, 435, 437, 440, 445, 450, 451, 222, 226, 231, 300, 301, 418, 481, 495, FOR 230, FOR 259; 257/204, 206, 288, 336, 349, 347, 647, 648

(56) References Cited

U.S. PATENT DOCUMENTS 6,352,903 B1 * 3/2002 Rovedo et al. ............. 438/387
6,380,010 B2 * 4/2002 Brigham et al. ............ 438/161

* cited by examiner

Primary Examiner—George Fourson
Assistant Examiner—Julio J. Maldonado
(74) Attorney, Agent, or Firm—Nath & Associates PLLC; Harold L. Novick

(57) ABSTRACT

The invention discloses methods of fabricating a semiconductor device structure having low source/drain junction capacitances and low junction leakage currents. The low source/drain junction capacitances are obtained by implementing in a self-aligned manner the major portions of the heavily-doped source and drain regions of a device over the trench-isolation region using highly-conductive silicided polycrystalline- or amorphous-semiconductor and the junction leakage currents resulting from the generation/recombination current in the depletion regions of the heavily-doped source and drain junctions due to the implant-induced defects can be much reduced or eliminated. Moreover, the contacts are made on the silicided heavily-doped source and drain regions over the trench-isolation regions, the traditional contact-induced leakage current due to the shallow source/drain junction can be completely eliminated by the present invention. In addition, the contacts are implemented over the trench-isolation regions, the effective area per device is much reduced by using the present invention as compared to existing device structure and its implementation. As a consequence, the present invention offers a semiconductor device structure for high-density and high-performance integrated-circuits implementation.

38 Claims, 7 Drawing Sheets

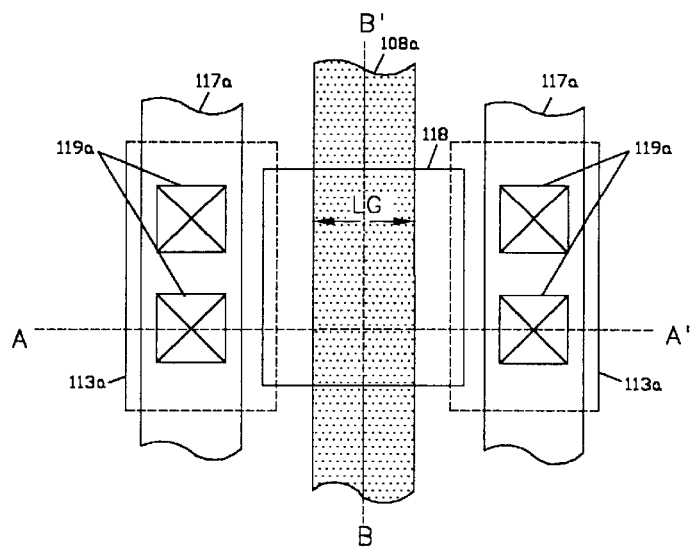
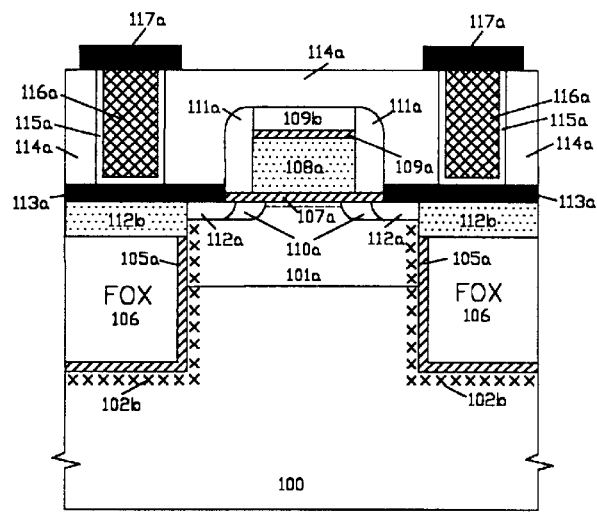
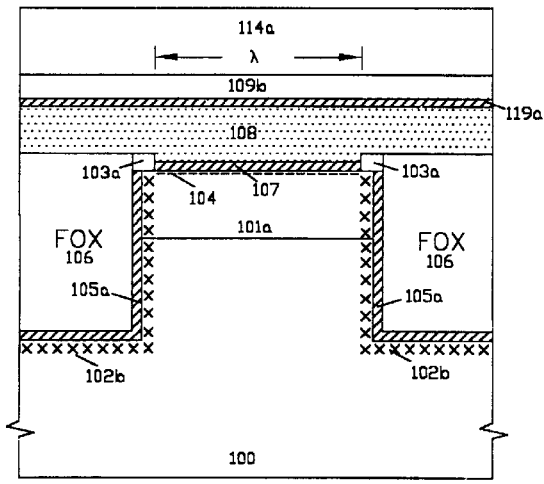
FIG.3A
FIG.3B
FIG.3C

METHODS OF FABRICATING A SEMICONDUCTOR DEVICE STRUCTURE FOR MANUFACTURING HIGH-DENSITY AND HIGH-PERFORMANCE INTEGRATED-CIRCUITS

BACKGROUND OF THE INVENTION

1. Field of the Invention

The invention relates to semiconductor integrated-circuits manufacturing and more particularly to a semiconductor device structure for manufacturing high-density and high-performance integrated-circuits.

2. Description of Related Art

The metal-oxide-semiconductor field-effect transistor (MOSFET) becomes a major device for existing very high-density integrated-circuits manufacturing. Basically, there are two kinds of regions for integrated-circuits implementation in a semiconductor substrate: one is the active area and the other is the isolation area. The active area is the exposed semiconductor surface for device fabrication, which is surrounded by the isolation regions having thicker dielectric oxides over the semiconductor surface. The isolation area can be formed by the local oxidation of silicon (LOCOS) as shown in FIG. 1 or by the shallow-trench-isolation (STI) as shown in FIG. 2. In general, the LOCOS isolation needs higher temperature to grow the desired field oxides (FOX) 202a and the bird's beak having a width ΔW in each side is formed in the designated active area. Moreover, the doping impurities of the field-encroachment implant 201a used to increase the field threshold-voltage may diffuse into the active area and further decreases the active area, resulting in the so-called narrow-width effects. In addition, the structure surface after forming LOCOS isolation is not planarized, which becomes difficult for fine-line lithography. For the minimum-feature-size smaller than 0.25 $\mu$m, the shallow-trench-isolation as shown in FIG. 2 becomes a major trend for deep-submicrometer devices and their integrated-circuits fabrication. Comparing FIG. 1 to FIG. 2, it is clearly seen that the isolation area of using LOCOS is much larger than that of using STI due to the bird's beak formation and the doping-impurity diffusion of the field-encroachment implant. However, the device structure fabricated in the active area is still the same although the device dimension can be scaled according to the scaling rule based on device physics. For a semiconductor device in the channel-length direction (A–A') as shown in FIG. 2B, there are a thin gate-oxide layer 302 formed on a semiconductor substrate 100, a highly-conductive gate layer 303a on a thin gate-oxide layer 302, a capped dielectric layer 304a over the highly-conductive gate layer 303a, two dielectric spacers 306a formed along the sidewalls of the formed gate structure, two lightly-doped source and drain regions 305a, two heavily-doped source and drain regions 307a, two silicided regions 308a for source and drain contacts, two barrier-metal layers 310a, two plug-metal films 311a and two metal layers 312a for interconnect. As shown in FIG. 2C for the channel-width direction (B–B'), it is quite clear that the shallow-trench-isolation reduces largely the isolation area without sacrificing too much active area for capping the trench comers using the capping-oxide layer 301b. However, it is apparently seen from FIG. 1B and FIG. 2B that the heavily-doped source and drain regions occupy almost 70% of the active area and most of them are prepared for contacts. As a consequence, the source and drain junction capacitances which may limit the switching speed or the operating frequency of devices can not be easily scaled according to the scaling rule and the generation/recombination currents due to the depletion regions of the source and drain junctions become one of the major sources of device leakage currents. Moreover, the shallow source and drain junctions which are needed to reduce the short-cannel effects become a challenge for contact technology without producing the contact-induced defects.

It is therefore a first objective of the present invention to substantially reduce the area of the heavily-doped source and drain regions of a device in the active region, so that the junction capacitances of the heavily-doped source and drain regions with respect to the semiconductor substrate in the active region are reduced accordingly. As a result, high-speed and high-frequency operations of devices of the present invention for manufacturing integrated-circuits can be expected. Since the reduced heavily-doped source and drain regions are resided on the trench-isolation regions, it is therefore a second objective of the present invention to substantially reduce the generation/recombination currents in the depletion regions of the heavily-doped source and drain junctions. Moreover, the heavily-doped source and drain regions resided on the trench-isolation regions are the silicided conductive semiconductor layers for contacts or interconnections, it is a third objective of the present invention to eliminate the contact-induced source and drain junction failure or leakage currents. In addition, the effective area of a device is much reduced, it is therefore a fourth objective of the present invention to offer high-density devices for manufacturing high-density integrated-circuits.

SUMMARY OF THE INVENTION

Methods of fabricating a semiconductor device structure having low source and drain junction capacitances and low junction leakage currents are disclosed by the present invention, in which the major portions of the heavily-doped source and drain regions of a device in the active region are implemented in a self-aligned manner over the trench-isolation region by using highly-conductive silicided poly-crystalline or amorphous-semiconductor layers. The device structure of the present invention exhibits several remarkable features as compared to those of existing device structure. The first feature of the present invention is very low source and drain junction capacitances, so much higher switching speed or operating frequency can be obtained by using a device structure of the present invention for manufacturing high-density integrated-circuits. The second feature of the present invention is very small area for the depletion regions of the heavily-doped source and drain junctions, the generation/recombination currents in the depletion regions of the source and drain junctions and the conventional diffusion current can be much reduced, so ultra-low standby leakage current can be obtained for manufacturing high-density integrated-circuits. The third feature of the present invention is that the contacts of the source and drain regions of a device are resided on the trench-isolation region, the contact-induced defects or spikings for shallow source and drain junctions can be eliminated, the elaborate contact technologies are not required and the yield problems of integrated-circuits manufacturing due to the excess leakage current or junction failures are eliminated. The fourth feature of the present invention is that the effective area occupied by each device of the present invention is much smaller as compared to that of existing devices, integrated-circuits of much higher density can be manufactured by the present invention. As a consequence, the present invention can be used to manufacture integrated-circuits with high-density, high-speed and ultra-low standby leakage current.

BRIEF DESCRIPTION OF THE DRAWINGS

FIG. 3A through FIG. 3C show a top view and the schematic cross-sectional views of a device fabricated by the present invention using advance shallow-trench-isolation.

DETAILED DESCRIPTION OF THE PREFERRED EMBODIMENTS

Figure 1A:
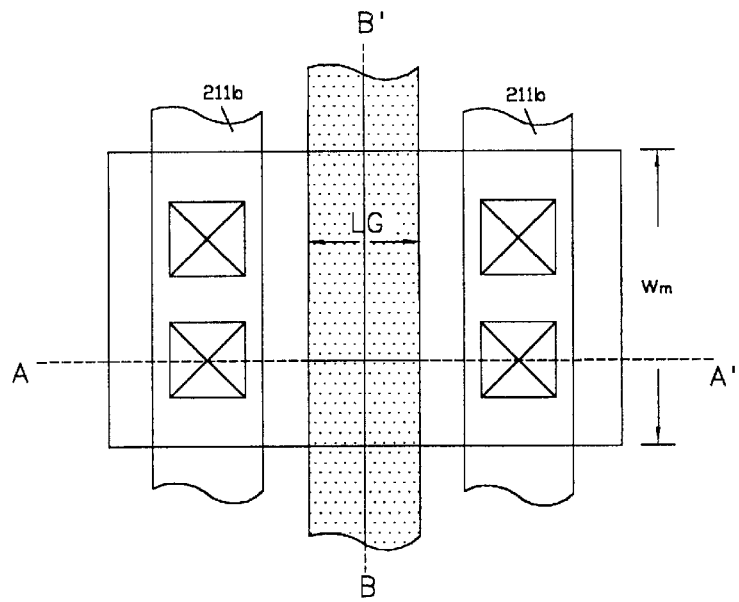
FIG. 1A through FIG. 1C show a top view and the schematic cross-sectional views of a device fabricated by using conventional LOCOS isolation.
Figure 1B:
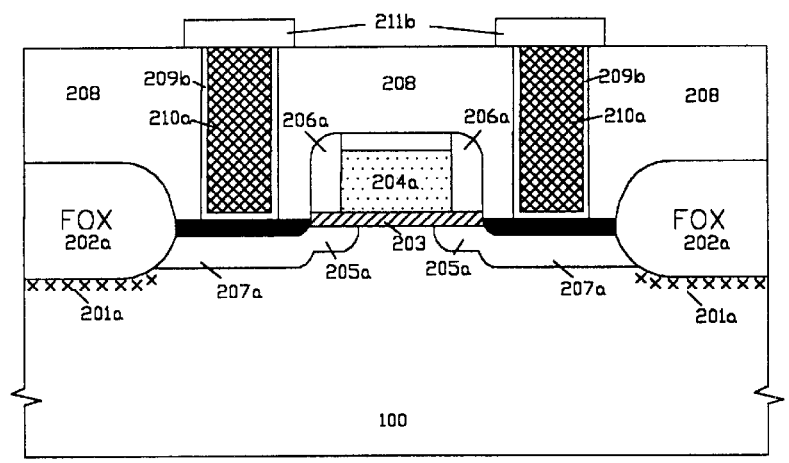
Figure 1C:
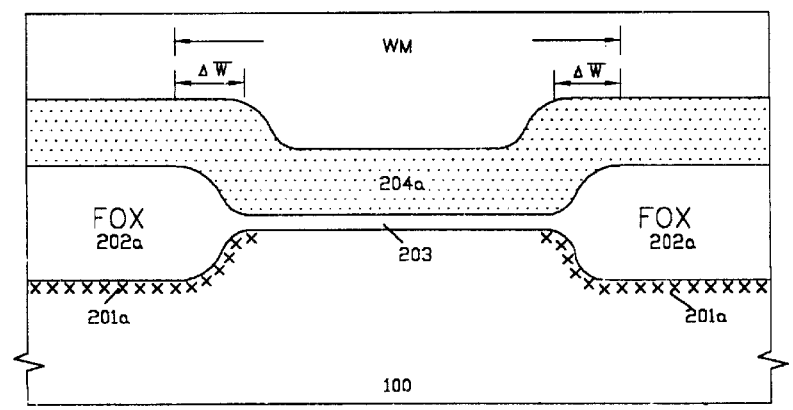
Figure 2A:
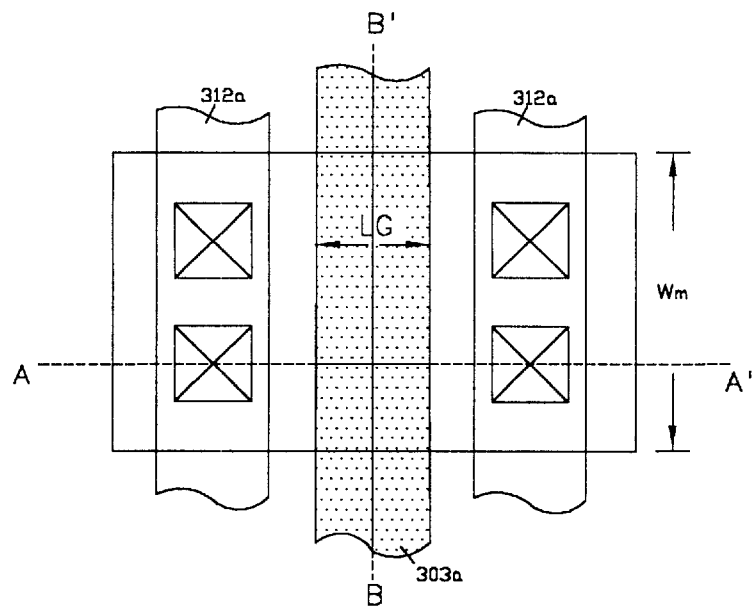
FIG. 2A through FIG. 2C show a top view and the schematic cross-sectional views of a device fabricated by using existing shallow-trench-isolation.
Figure 2B:
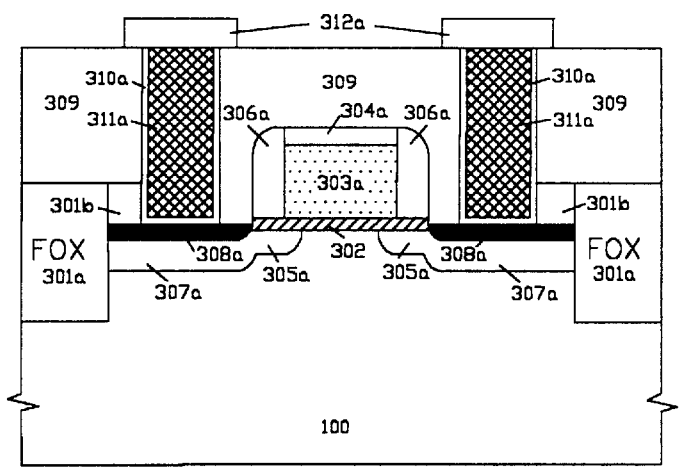
Figure 2C:
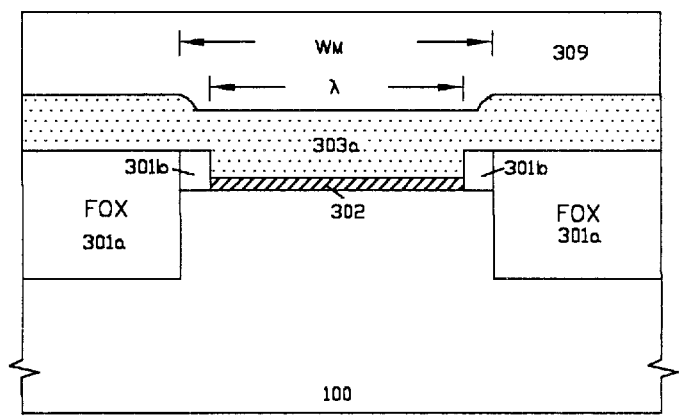

Referring now to FIG. 3A through FIG. 3C, there are shown a top view and the cross-sectional views of the present invention. FIG. 3A shows a top view of a device fabricated in an active region 118 isolated by using new shallow-trench-isolation techniques having the capping-oxide spacers 103a formed in the trench-isolation regions 106 (FOX) and the thin-oxide layers 105a and the trench-surface encroachment implant regions 102b. The source and drain contact cuts 119a are formed on the heavily-doped source and drain regions 112b made by using a highly-conductive polycrystalline-silicon or amorphous-silicon film capped by a silicide layer 113a. The conductive gate layer 108a is a doped ploycrystalline-silicon or amorphous-silicon layer capped by a silicide layer. The metal layers 117a are used to form the first-level interconnections of the source and the drain of the present device to the source and the drain of other devices. FIG. 3B shows a cross-sectional view in the channel-length direction (A–A'), in which the gate insulator layer 107a is formed on a retrograde-well 101a over the semiconductor substrate 100, the conductive gate layer 108a is formed on the gate insulator layer 107a, a capping-oxide layer 109a is formed on the conductive gate layer 108a, a masking dielectric layer 109b preferably made of silicon-nitrides is formed on the capping-oxide layer 109a. The silicon-nitride spacers 111a are formed on the sidewalls of the gate region and over the gate insulator layer 107a. The lightly-doped source/drain regions 110a and the heavily doped source/drain regions 112a are formed in a retrograde-well 101a over the semiconductor substrate 100. The major portions of the heavily-doped source/drain regions are formed on the trench field-oxide (FOX) layers 106 using highly-conductive polycrystalline-silicon or amorphous-silicon layer linked with the heavily-doped source/drain regions 112a formed in a retrograde-well 101a over the semiconductor substrate 100 directly and further capped by the silicide layers 113a. The contact cuts 119a through the planarized dielectric layer 114a are filled with the barrier-metal layers 115a and the plug-metal films 116a. FIG. 3C shows a cross-sectional view in the channel-width direction (B–B'), in which the capping-oxide spacers 103a formed in the trench-isolation region are surrounding the corners of the active region 118 to eliminate the field emission from the corners of the active region without sacrificing the active area 118. Moreover, the trenched surface is oxidized to form the thin-oxide layers 105a and is properly implanted to form the field-encroachment implant regions 102b, the leakage current due to the generation/recombination current from the depletion regions and the interface traps of the trench surfaces can be much reduced or eliminated.

Apparently, a device structure of the present invention shown in FIG. 3A through FIG. 3C exhibits the following features: very small source/drain junction capacitances; very small source/drain junction leakage currents; very small device area occupied including the active area and the isolation area. The detailed process steps of manufacturing a device structure of the present invention shown in FIG. 3A through FIG. 3C are described below, as shown in FIGS. 4A through 4K.

Figure 4A:
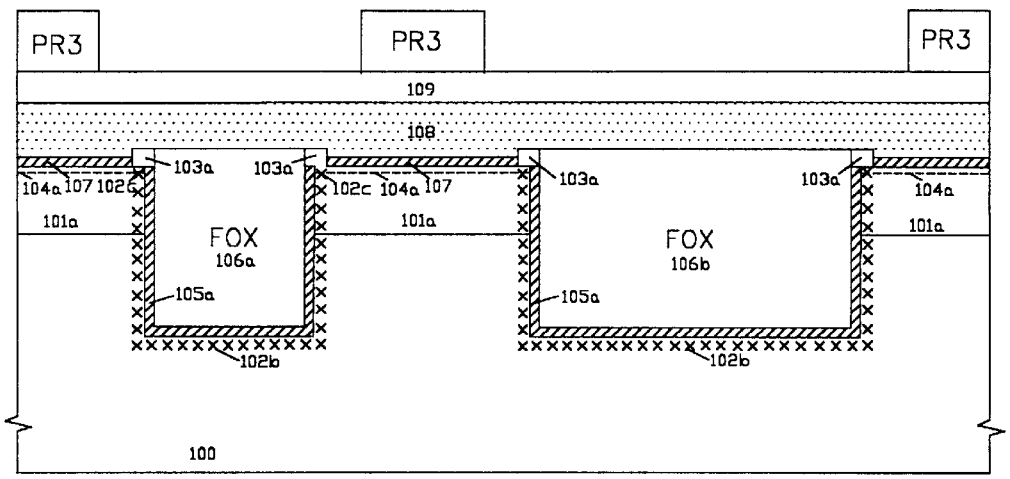
FIG. 4A through FIG. 4K show the schematic cross-sectional views of the process steps and the structures of devices fabricated by the present invention using advance shallow-trench-isolation.

Referring now to FIG. 4A, it is shown a cross-sectional view in the channel-length direction (A–A' shown in FIG. 3B) in which the shallow-trench-isolation (STI) technique is used to form the trench-isolation regions 106a and 106b as marked by FOX. The trench surfaces are oxidized to have a thin-oxide layer 105a formed in order to eliminate the trench etching-induced defects and followed by the field-encroachment implant to form the implanted regions 102b using rotated large-tilt-angle implantation. As shown in FIG. 4A, the thin-oxide layer 105a and the implanted regions 102b at the top surface are located under the capping-oxide spacers 103a formed in the trench-isolation regions and formed on the sidewalls of the patterned multilayer masking structure using the masking photoresist PR1 (not shown). The capping-oxide spacers 103a are very important to eliminate the field emission from the trench corners to the conductive gate layer 108 as shown in FIG. 3C. After forming a thin gate-dielectric layer 107 in the active regions, a conductive gate layer 108 is deposited. The conductive gate layer 108 can be a doped polycrystalline-silicon or doped amorphous-silicon layer further capped with a silicide layer. A masking dielectric layer 109 is then formed over the conductive gate layer 108 and can be a silicon-nitride layer or a composite layer having a masking silicon-nitride layer 109b on a silicon-oxide layer 109a. The masking photoresist PR3 is formed on the whole structure and then is patterned to define the gate-lengths ($L_G$) of devices and the gate interconnections using the conductive gate layer 108 as shown in FIG. 3A for a single device and FIG. 4A for multiple devices. It is noted that two trench-isolation widths are demonstrated in FIG. 4A for two-kinds of device interconnection, in which the narrow one in the left-hand side is used for common-source/common-drain contact and the wider one in the right-hand side is used for separate source/drain contacts.

It should be emphasized that the semiconductor substrate 100 shown in FIG. 3 and FIG. 4 can be a p-type semiconductor substrate or an n-type semiconductor substrate. For simplicity, the retrograde p-wells 101a are formed over the semiconductor substrate 100 using the masking photoresist PR2A (not shown) and the devices shown are n-channel MOSFETs. Moreover, the shallow-trench-isolation structure shown is only for demonstration, other shallow-trench-isolation structure or isolation techniques can also be used to fabricate the device structure of the present invention.

Figure 4B:
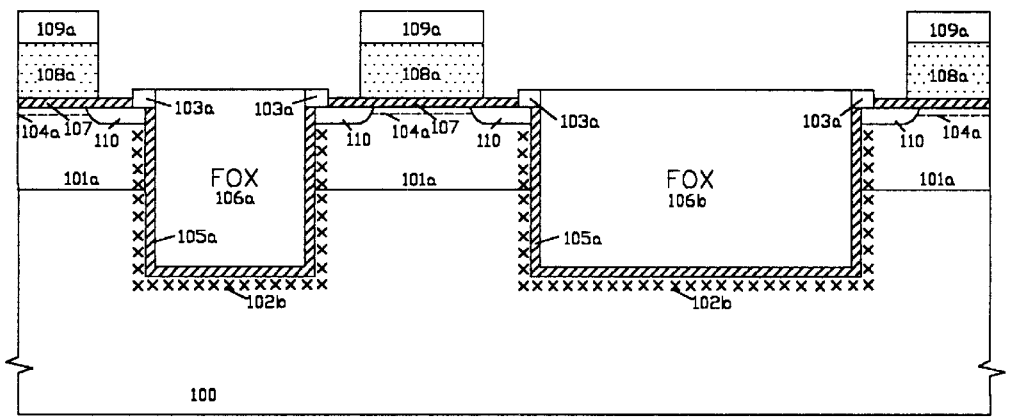

The patterned masking photoresist PR3 shown in FIG. 4A is used as a mask to form the gate structures shown in FIG. 4B through the selective etchings of the masking dielectric layer 109 and the conductive gate layer 108 using anisotropic dry etchings and the patterned masking photoresist PR3 is then stripped. The ion-implantation is performed in a self-aligned manner to form the lightly-doped source/drain regions 110 of the devices using a patterned masking photoresist PR4A (not shown) and then stripping the patterned masking photoresist PR4A, as shown in FIG. 4B.

Figure 4C:
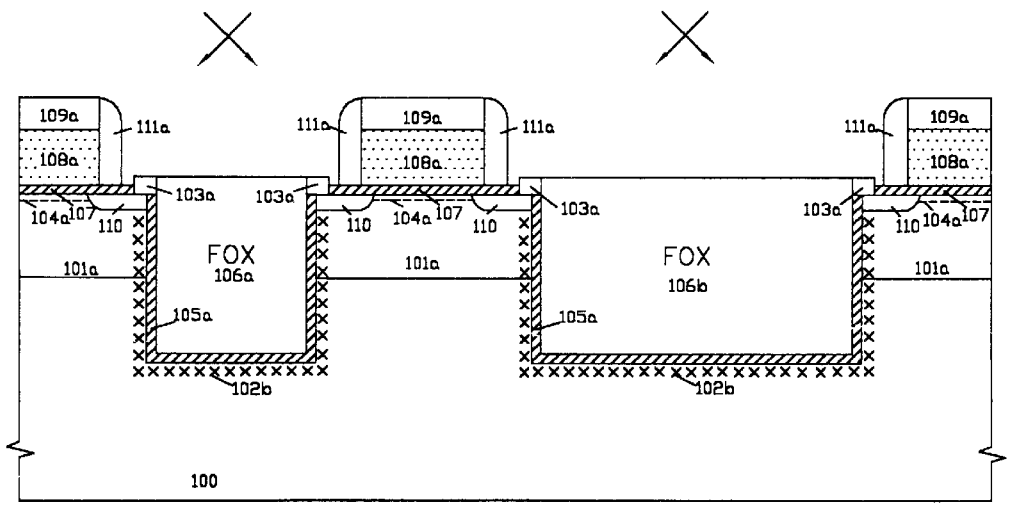

FIG. 4C shows that the dielectric spacers 111a are formed on the sidewalls of the formed conductive gate regions. The dielectric spacers 111a can be formed by depositing a conformable dielectric layer over the formed gate structure followed by etching back using anisotropic dry etching. The conformable dielectric layer is preferably deposited by low-pressure chemical-vapor-deposition (LPCVD) and is preferably made of silicon-nitrides. The halo-implant using a patterned masking photoresist PR5A (not shown) can be performed by using large-tilt-angle implantation to improve the punch-through voltage of devices and then stripping the patterned masking photoresist PR5A. However, the junction depth of the heavily-doped source/drain junctions in the active regions can be very shallow because the major portions of the heavily-doped source/drain regions are located in the trench-isolation regions using highly-conductive semiconductor layer 112b and are also used as the contact regions, the punch-through voltage of devices would be larger for devices of the present invention as compared to that of traditional devices.

Figure 4D:
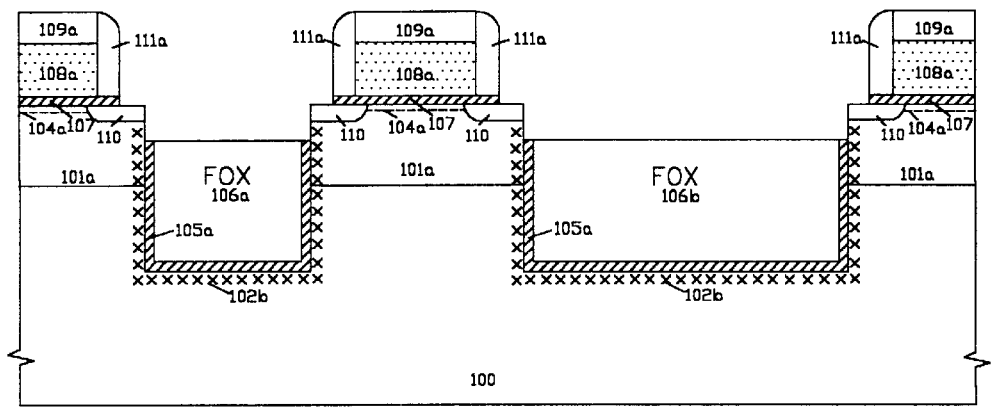

FIG. 4D shows the oxides including a thin gate dielectric layer 107, the capping-oxide spacers 103a, the thin-oxide layer 105a and the trench field-oxide 106a and 106b outside of the dielectric spacers 111a as shown in FIG. 4C are selectively etched in a self-aligned manner to a depth approximately equal to or slightly larger than the junction depth of the lightly-doped source and drain regions 110.

Figure 4E:
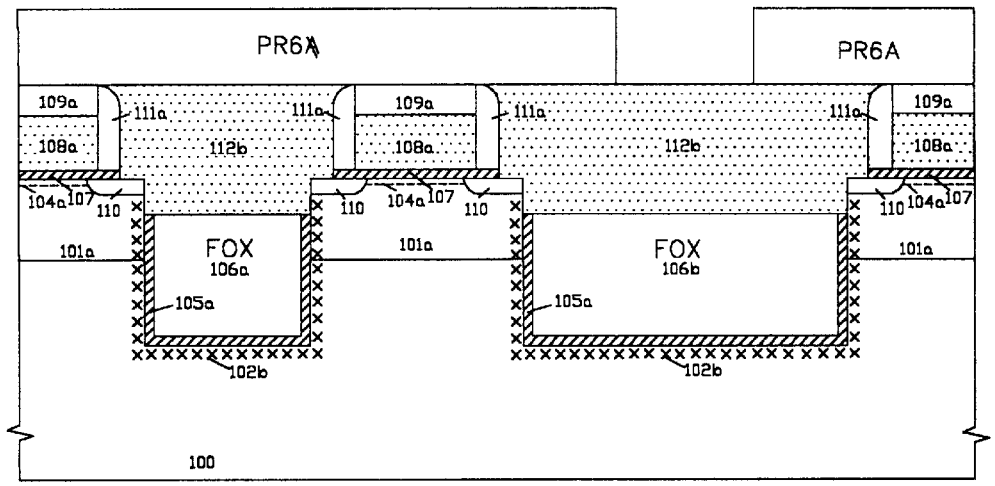
Figure 4F:
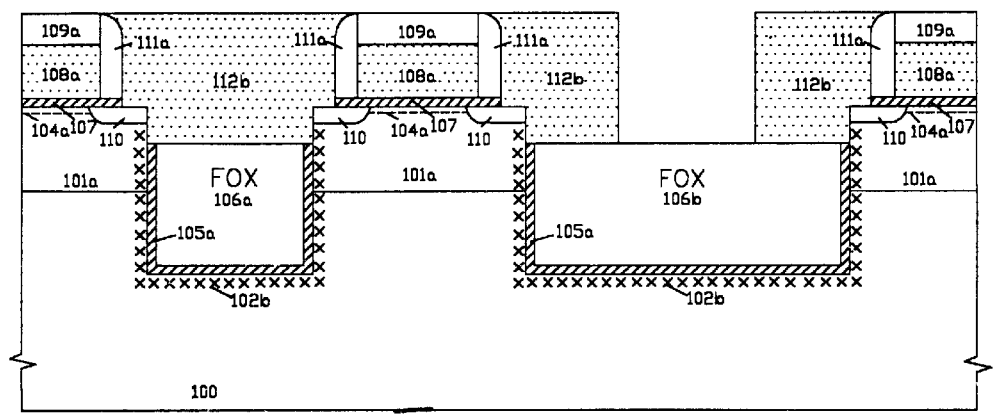

FIG. 4E shows that the formed structure shown in FIG. 4D is filled with a conformable thick conductive semiconductor film 112b to a level over the top level of the masking dielectric layer 109a and the planarization of the filled thick conductive semiconductor film 112b is performed preferably by chemical-mechanical polishing (CMP) using the masking dielectric layer 109a as a polishing stop. The conformable thick conductive semiconductor film can be a doped polycrystalline-silicon or doped amorphous-silicon film deposited by LPCVD. The masking photoresist PR6 is formed and patterned to define the source/drain interconnect and the contact area of devices, as shown in a top view of FIG. 3A. As shown in FIG. 4F, the patterned masking photoresist PR6 is used as a mask to perform the etching of the planarized conductive semiconductor film 112b and then the patterned masking photoresist PR6 is stripped.

Figure 4G:
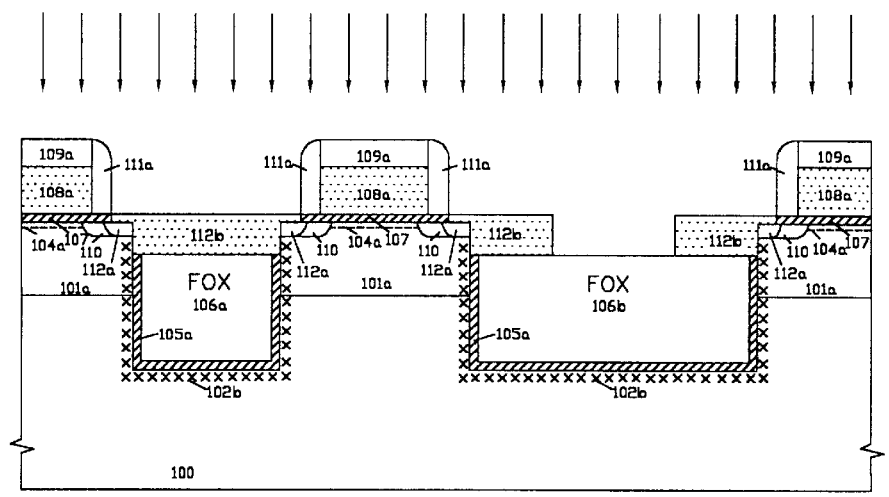

As shown in FIG. 4G, the remained conductive semiconductor films 112b shown in FIG. 4F are anisotropically etched back in a self-aligned manner to a depth approximately equal to the top level of the thin gate-dielectric layer 107 or slightly higher than the top level of the thin gate-dielectric layer 107 using anisotropic dry etching. The ion-implantation is then performed to form the heavily-doped source and drain regions 112a in the retrograde-wells 101a over the semiconductor substrate 100 and the remained conductive semiconductor layer 112b using a patterned masking photoresist PR7A (not shown), as shown in FIG. 4G.

Figure 4H:
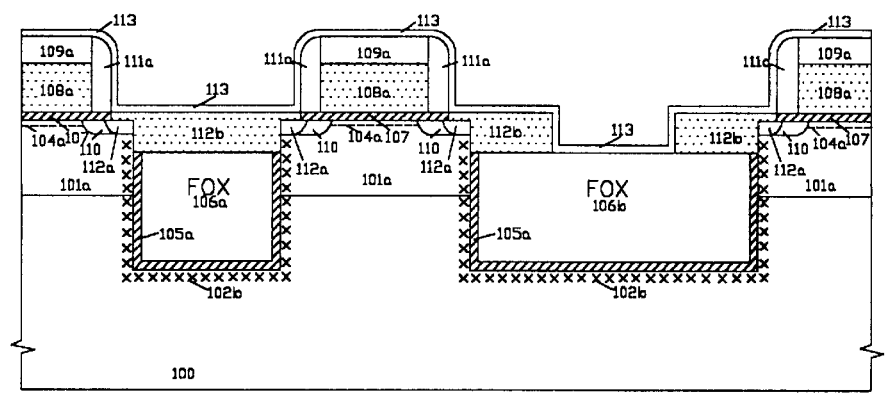
Figure 4I:
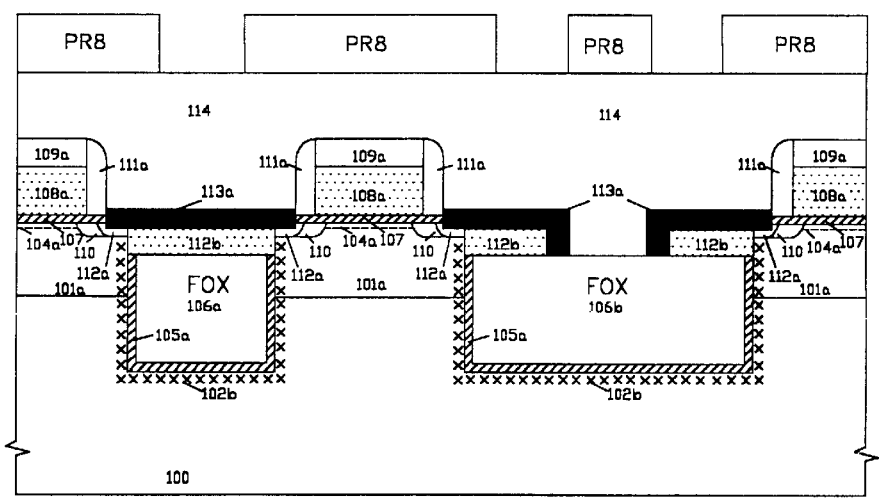

FIG. 4H shows a refractory metal layer 113 is deposited, followed by annealing in a $N_2$ ambient to form the silicide layer over the heavily-doped source/drain regions 112a formed in the retrograde-wells 101a over the semiconductor substrate 100 and the polycrystalline-silicon or amorphous-silicon layers 112b on the trench-isolation regions 106a and 106b and the metal-nitride layer over the silicide layer and the dielectric layer such as silicon-nitride or silicon-oxide. The preferred refractory metal is titanium or cobalt, so the silicide layer is titanium-disilicide ($TiSi_2$) or cobalt-disilicide ($CoSi_2$) and the metal-nitride layer is titanium-nitride (TiN) or cobalt-nitride (CoN). Using a wet-chemical solution of $NH_4OH:H_2O_2:H_2O$ (1:1:5), the titanium-nitride or cobalt-nitride layers are removed and the titanium-disilicide or cobalt-disilicide layers 113a over silicon (mono- or poly- or amorphous-silicon) are remained, as shown in FIG. 4I. A thick interlayer dielectric film 114 is then deposited, followed by planarizing the deposited thick interlayer dielectric film 114 using CMP. The thick interlayer dielectric film 114 is preferably made of silicon-oxides doped with boron and phosphorous impurities (BP glass) and is preferably deposited by high-density plasma CVD. The masking photoresist PR8 is formed on the planarized thick interlayer dielectric layer 114 and is then patterned as shown in FIG. 4I to open the contact holes.

Figure 4J:
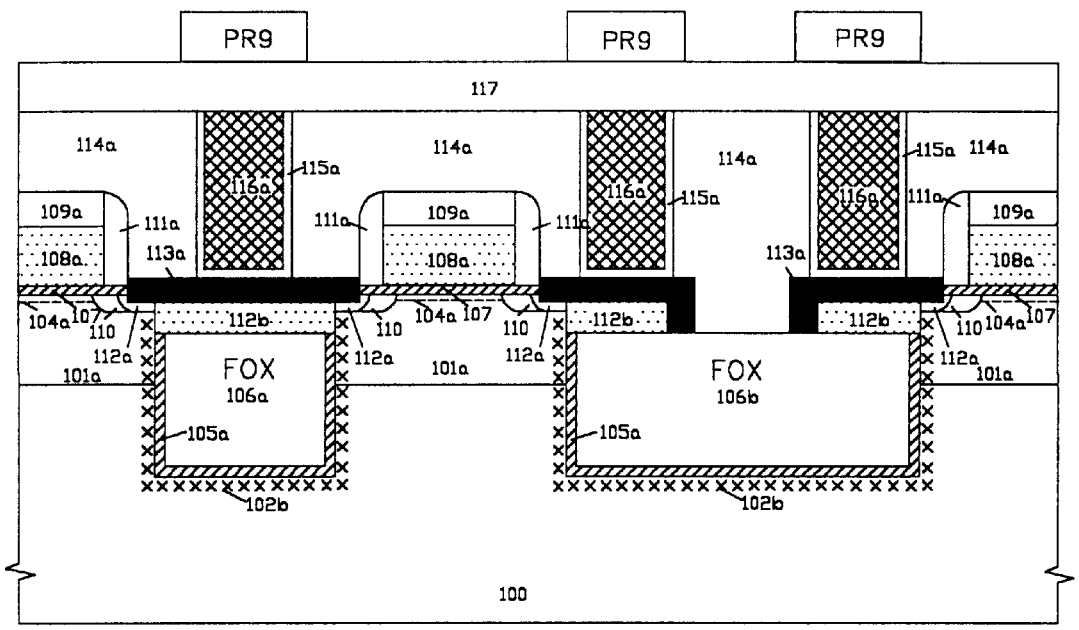
Figure 4K:
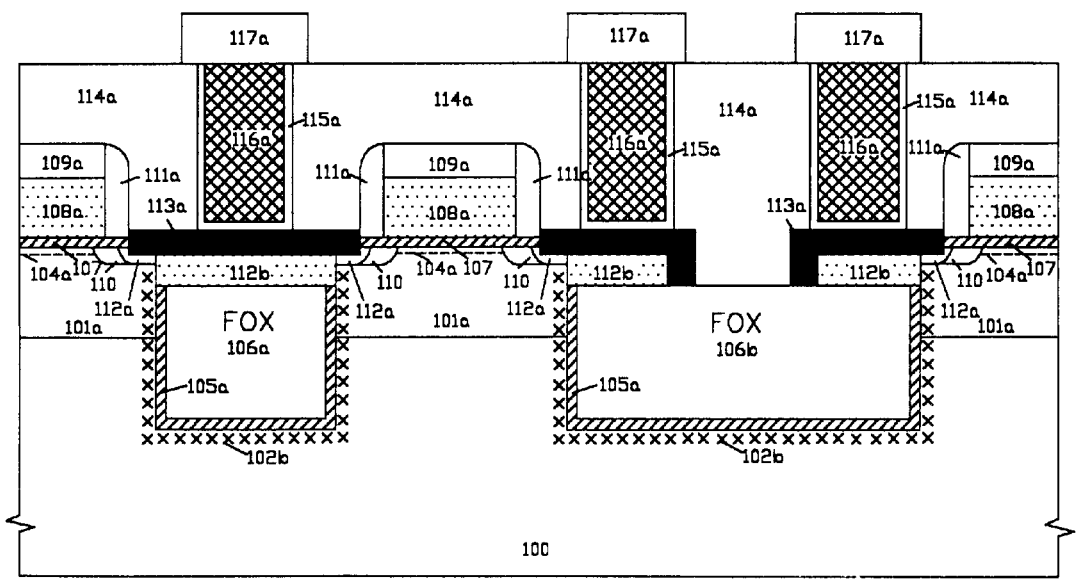

FIG. 4J shows that the contact holes are filled with the barrier-metal layers 115a and the plug-metal films 116a, followed by planarizing the structure surface using CMP to remove the excess barrier-metal and plug-metal films over the planarized thick interlayer dielectric film 114. The barrier-metal layer 115a is preferably a titanium-nitride layer deposited by sputtering or CVD and the plug-metal film 116a is preferably a tungsten film deposited by sputtering or CVD. The first-level interconnection metal layer 117 is deposited as shown in FIG. 4J and is then patterned and etched by the patterned masking photoresist PR9 as shown in FIG. 4J to form the first-level interconnection metal layer 117a, followed by stripping the patterned masking photoresist PR9. The first-level interconnection metal layer 117 can be a composite metal layer consisting of a AlCu alloy film over a TiN layer or a copper layer over a barrier-metal layer. The finished structure is shown in FIG. 4K. The multi-level interconnection can be easily formed by using the well-known arts.

The embodiments shown in FIG. 3 through FIG. 4 use retrograde p-wells formed over a semiconductor substrate 100 for demonstration only. It should be well understood by those skilled in the art that the opposite doping type of the retrograde-wells can also be used to simultaneously fabricate the opposite conductivity type of devices for integrated-circuits implementation by using the methods as disclosed by the present invention with only modification of the implant doping type using the additional patterned masking photoresist having a mask of the reverse tone.

While the invention has been particularly shown and described with reference to the preferred embodiments thereof, it will be understood by those skilled in the art that various changes in form and details may be made without departing from the true spirit and scope of the invention.

What is claimed is:

1. A method of fabricating a semiconductor device structure having major portions of heavily-doped source and drain regions resided on a trench-isolation region using highly-conductive semiconductor layers, the method comprising the steps of:

providing a semiconductor substrate;

forming a shallow-trench-isolation (STI) structure for said semiconductor device structure having a gate-dielectric layer formed on a surface of a retrograde-well over said semiconductor substrate and a highly-conductive gate layer deposited over said gate-dielectric layer and a planarized capping-oxide layer and a planarized trench field-oxide layer, and said planarized capping-oxide layer being formed along a sidewall of said planarized trench field-oxide layer;

depositing a masking dielectric layer over said highly-conductive gate layer;

defining a gate region and a gate interconnection of said semiconductor device structure using a patterned masking photoresist PR3;

removing selectively said masking dielectric layer and said highly-conductive gate layer using anisotropic dry etching to form said gate region and said gate interconnection of said semiconductor device structure, followed by stripping said patterned masking photoresist PR3;

implanting doping impurities in a self-aligned manner into said retrograde-well using a patterned masking photoresist PR4 to form lightly-doped source and drain regions or heavily-doped source and drain regions and then stripping said patterned masking photoresist PR4;

forming dielectric spacers on sidewalls of said gate region and said gate interconnection by depositing a conformable dielectric layer followed by etching back said conformable dielectric layer;

performing pocket or halo-implant using a patterned masking photoresist PR5 to form punch-through stops in said retrograde-well over said semiconductor substrate using large-tilt-angle implantation and then stripping said patterned masking photoresist PR5;

removing said gate-dielectric layers and said planarized capping-oxide layers outside of said dielectric spacers and simultaneously etching said planarized trench field-oxide layer to a depth approximately equal to or larger than a junction depth of said lightly-doped source and drain regions or said heavily-doped source and drain regions in a self-aligned manner by using said masking dielectric layer over said gate region, said gate interconnection and said dielectric spacers as a hard etching mask;

depositing a conductive semiconductor film over a formed structure to a level higher than a top level of said masking dielectric layer;

planarizing said conductive semiconductor film using chemical-mechanical polishing (CMP) and using said masking dielectric layer as a polishing stop;

patterning planarized conductive semiconductor films to define said heavily-doped source and drain regions made of said conductive semiconductor film using a patterned masking photoresist PR6 followed by selectively removing said conductive semiconductor film and then stripping said patterned masking photoresist PR6;

etching back formed conductive semiconductor films in a self-aligned manner to a depth approximately equal to a top level of said gate-dielectric layer;

implanting doping impurities in a self-aligned manner to form said heavily-doped source and drain regions in semiconductor surface regions of said retrograde-well and to dope remained conductive semiconductor films using a patterned masking, photoresist PR7 and then stripping said patterned masking photoresist PR7;

depositing a refractory metal film over a formed structure surface followed by annealing in a nitrogen ambient to perform self-aligned silicidation of said remained conductive semiconductor films;

removing refractory metal-nitride film using a wet-chemical solution;

depositing an interlayer dielectric film and planarizing said interlayer dielectric film;

patterning planarized interlayer dielectric film using a patterned masking photoresist PR8 to form contact holes on said heavily-doped source and drain regions in said trench-isolation region and etching said contact holes followed by stripping said patterned masking photoresist PR8;

depositing a barrier-metal layer over a formed structure surface and then depositing a plug-metal film to fill up said contact holes;

planarizing a formed structure surface by removing said barrier-metal layer and said plug-metal film over a surface of said planarized interlayer dielectric film;

depositing a first-level interconnection metal film over a planarized structure surface; and patterning said first-level interconnection metal film by using a patterned masking photoresist PR9 and then selectively removing said first-level interconnection metal film followed by stripping said patterned masking photoresist PR9.

2. The method of claim 1, wherein said semiconductor substrate is selected from a group consisting of a p-type semiconductor substrate, an n-type semiconductor substrate, an epitaxial substrate of $p/p^+$ or $n/n^+$ or $p/n$ or $n/p$, or a silicon-on-insulator (SOI) wafer.

3. The method of claim 1, wherein said highly-conductive gate layer comprises a doped polycrystalline-silicon layer capped by a silicide layer or a doped amorphous-silicon layer capped by a silicide layer.

4. The method of claim 1, wherein said masking dielectric layer over said highly-conductive gate layer comprises a silicon-nitride layer or a composite layer having a silicon-nitride layer over a silicon-oxide layer, as deposited by low-pressure chemical-vapor-deposition (LPCVD).

5. The method of claim 1, wherein doping type of said lightly-doped source and drain regions is opposite to said doping type of said retrograde-well formed over said semiconductor substrate.

6. The method of claim 1, wherein said dielectric spacers formed on said sidewalls of said gate region and said gate interconnection comprise silicon-nitride as deposited by LPCVD.

7. The method of claim 1, wherein said conductive semiconductor film comprises a polycrystalline-silicon film or an amorphous-silicon film, as deposited by LPCVD.

8. The method of claim 1, wherein doping type of said heavily-doped source and drain regions formed in either said retrograde-well over said semiconductor substrate or said remained conductive semiconductor films is the same as that of said lightly-doped source and drain regions formed in said retrograde-well over said semiconductor substrate.

9. The method of claim 1, wherein said refractory metal film deposited to perform self-aligned silicidation comprises cobalt or titanium and said wet-chemical solution for removing said cobalt-nitride or said titanium-nitride film comprises a mixture of $NH_4OH:H_2O_2:H_2O$ (1:1:5).

10. The method of claim 1, wherein said thick interlayer dielectric film comprises an oxide film or a doped-oxide film, as deposited by high-density plasma CVD or CVD.

11. The method of claim 1, wherein said barrier-metal layer deposited over said formed structure surface having said contact holes comprises a titanium-nitride layer as deposited by sputtering or CVD.

12. The method of claim 1, wherein said plug-metal film deposited to fill up said contact holes comprises a tungsten film as deposited by sputtering or CVD.

13. The method of claim 1, wherein said first-level interconnection metal film comprises a copper-aluminum alloy film over a barrier-metal layer or a copper film over a barrier-metal layer or an aluminum film over a barrier-metal layer.

14. The method of claim 1, wherein said shallow-trench-isolation structure is formed further comprising the steps of:

forming a multilayer masking structure over said semiconductor substrate comprising a masking silicon-nitride layer on its top as a hard etching mask;

patterning said multilayer masking structure to form an active region for said semiconductor device structure using a patterned masking photoresist PR1 and then selectively removing said multilayer masking structure using anisotropic dry etching followed by stripping said patterned masking photoresist PR1;

forming oxide spacers on sidewalls of a patterned multi-layer masking structure;

etching shallow trenches in a self-aligned manner using said patterned multilayer masking structure and said oxide spacers as a hard etching mask;

oxidizing a surface of said shallow trenches to form an oxide layer for eliminating trench etching-induced defects;

performing field-encroachment implant to form an implanted region under said oxide layer over said shallow trenches;

filling up gaps formed by said shallow trenches and said patterned multilayer masking structure with a trench field-oxide film and then planarizing said trench field-oxide film using said masking silicon-nitride layer as a polishing stop; and etching back planarized trench field-oxide film in a self-aligned manner to simultaneously etch said trench field-oxide film and said oxide spacers to a depth smaller than a thickness of said masking silicon-nitride layer for a first shallow-trench-isolation structure and to a depth larger than a thickness of said masking silicon-nitride layer for a second shallow-trench-isolation structure.

15. The method of claim 14, wherein said first shallow-trench-isolation structure is formed by using a first multilayer masking structure consisting of said masking silicon-nitride layer over a pad-oxide layer and further comprising the steps of:

removing said masking silicon-nitride layer using wet-chemical etching or anisotropic dry etching;

implanting selectively doping impurities across said pad-oxide layer to form said retrograde-well of a conductivity type and then implanting doping impurities to adjust threshold-voltage and punch-through voltage of said semiconductor device structure using a patterned masking photoresist PR2A and then stripping said patterned masking photoresist PR2A;

removing said pad-oxide layer and simultaneously etching remained oxide-spacers to form said planarized capping-oxide layer and remained trench field-oxide film to form said planarized trench field-oxide layer using wet-chemical etching or anisotropic dry etching;

oxidizing an exposed semiconductor surface of said retrograde-well to grow a gate-dielectric layer; and depositing a suicide layer over a doped polycrystalline-silicon layer or a doped amorphous-silicon layer to form a highly-conductive gate layer over a formed structure surface for finishing said shallow-trench-isolation structure.

16. The method of claim 14, wherein said second shallow-trench-isolation structure is formed by using a second multilayer masking structure consisting of said masking silicon-nitride layer over a conductive semiconductor layer on said gate-dielectric layer, the method comprising the steps of:

forming a sacrificial-oxide layer over said semiconductor substrate;

implanting doping impurities selectively across said sacrificial-oxide layer to form said retrograde-well of a conductivity type and then implanting doping impurities to adjust threshold voltage and punch-through voltage of said semiconductor device structure using a patterned masking photoresist PR2B and then stripping said patterned masking photoresist PR2B;

removing said sacrificial-oxide layer on said retrograde-well over said semiconductor substrate and growing said gate-dielectric layer; and depositing a conductive semiconductor layer over said gate-dielectric layer and then depositing said masking silicon-nitride layer to form said second multilayer masking structure.

17. The method of claim 16, wherein said second shallow-trench-isolation structure is formed by using said second multilayer masking structure and further comprising the steps of:

removing said masking silicon-nitride layer using wet-chemical etching or anisotropic dry etching; and depositing a silicided conductive gate layer over said conductive semiconductor layer to form said highly-conductive gate layer for finishing said shallow-trench-isolation structure.

18. The method of claim 17, wherein said conductive semiconductor layer comprises a doped ploycrystalline-silicon layer or a doped amorphous-silicon layer, as deposited by LPCVD.

19. The method of claim 17, wherein said silicided conductive gate layer comprises a silicide layer over a doped polycrystalline-silicon layer or a doped amorphous-silicon layer and said silicide layer comprises a tungsten-suicide layer or other refractory metal-silicide layer.

20. A method of fabricating integrated-circuits using a semiconductor device structure having major portions of heavily-doped source and drain regions resided on a trench-isolation region using a highly-conductive semiconductor layer capped by a silicide layer, the method comprising the steps of:

providing a semiconductor substrate;

forming a shallow-trench-isolation structure for said semiconductor device structure of two conductivity types separately fabricated in retrograde-wells of two types formed in active regions of said semiconductor substrate having a gate-dielectric layer formed over surfaces of said retrograde-wells in said active regions and a highly-conductive gate layer deposited over said gate-dielectric layer, a planarized capping-oxide layer and a planarized trench field-oxide layer;

depositing a masking dielectric layer over said highly-conductive gate layer;

patterning gate regions and gate interconnections of said semiconductor device structures using a patterned masking photoresist PR3;

removing selectively said masking dielectric layer and said highly-conductive gate layer using anisotropic dry etching to form said gate regions and said gate interconnections of said semiconductor device structures, followed by stripping said patterned masking photoresist IPR3;

implanting doping impurities of a first type in a self-aligned manner to form said lightly-doped source and drain regions of said semiconductor device structure of a first conductivity type into said active regions having said retrograde-wells of said first-type using a patterned masking photoresist PR4A and then stripping said patterned masking photoresist PR4A;

implanting doping impurities of a second type in a self-aligned manner to form said lightly-doped source and drain regions or said heavily-doped source and drain regions of said semiconductor device structures of a second conductivity type into said active regions having said retrograde-wells of said second-type using a patterned masking photoresist PR4B and then stripping said patterned masking photoresist PR4B;

performing pocket or halo-implant of doping impurities of said second type for said semiconductor device structures of said first conductivity type using large-tilt-angle implantation to form punch-through stops in said retrograde-wells of said first-type using a patterned masking photoresist PR5A and then stripping said patterned masking photoresist PR5A;

performing said pocket or halo-implant of doping impurities of said first type for said semiconductor device structures of said second conductivity type using said large-tilt-angle implantation to form said punch-through stops in said retrograde-wells of said second type using a patterned masking photoresist PR5B and then stripping said patterned masking photoresist PR5B;

forming dielectric spacers on sidewalls of said gate regions and said gate interconnections by depositing a conformable dielectric layer followed by etching back said conformable dielectric layer;

removing said gate-dielectric layers and said planarized capping-oxide layers outside of said dielectric spacers and simultaneously etching said planarized trench field-oxide layer to a depth approximately equal to or larger than a junction depth of said lightly-doped source and drain regions or said heavily-doped source and drain regions in a self-aligned manner by using said masking dielectric layer over said gate regions, said gate interconnections and said dielectric spacers as a hard etching mask;

depositing a conductive semiconductor film over a formed structure to a level higher than a top level of said masking dielectric layer;

planarizing said conductive semiconductor film using chemical-mechanical polishing and using said masking dielectric layer as a polishing stop;

patterning planarized conductive semiconductor film to define said heavily-doped source and drain regions made of said planarized conductive semiconductor films using a patterned masking photoresist PR6 followed by selectively removing said planarized conductive semiconductive films and then stripping said patterned masking photoresist PR6;

etching back patterned conductive semiconductor films in a self-aligned manner to a depth approximately equal to a top level of said gate-dielectric layer;

implanting doping impurities of said first type using a patterned masking photoresist PR7A to form said heavily-doped source and drain regions in semiconductor surface of said retrograde-wells of said first type and to dope remained conductive semiconductor films for said semiconductor devices of said first conductivity type followed by stripping said patterned masking photoresist PR7A;

implanting doping impurities of said second type using a patterned masking photoresist PR7B to form said heavily-doped source and drain regions in said semiconductor surface of said retrograde-wells of said second type and to dope said remained conductive semiconductor films for said semiconductor devices of said second conductivity type followed by stripping said patterned masking photoresist PR7B;

depositing a refractory metal film over a formed structure surface followed by annealing in a nitrogen ambient to perform self-aligned silicidation of said remained conductive semiconductor films;

removing refractory metal-nitride films using a wet-chemical solution of $NH_4OH:H_2O_2:H_2O$ (1:1:5);

depositing a interlayer dielectric film and planarizing said interlayer dielectric film using CMP, patterning planarized interlayer dielectric film using a patterned masking photoresist PR8 to form contact holes on said heavily-doped source and drain regions over said trench-isolation regions and then etching said contact holes followed by stripping said patterned masking photoresist PR8;

depositing a barrier-metal layer over a formed structure surface having said contact holes and then depositing a plug-metal film to fill up said contact holes;

planarizing a formed structure surface by removing said barrier-metal layer and said plug-metal film over a surface of said planarized interlayer dielectric film;

depositing a first-level interconnection metal film over a formed structure surface; and patterning said first-level interconnection metal film using a patterned masking photoresist PR9 and then selectively removing said first-level interconnection metal film followed by stripping said patterned masking photoresist PR9.

21. The method of claim 20, wherein said semiconductor substrate is selected from a group consisting of a p-type semiconductor substrate, a n-type semiconductor substrate, an epitaxial substrate of $p/p^+$ or $n/n^+$ or p/n or n/p, or a silicon-on-insulator (SOI) wafer.

22. The method of claim 20, wherein said masking dielectric layer over said highly-conductive gate layer comprises a silicon-nitride layer or a composite layer having a silicon-nitride layer over a silicon-oxide layer, as deposited by low-pressure chemical-vapor-deposition (LPCVD).

23. The method of claim 20, wherein said doping impurities of said first type implanted comprise phosphorous or arsenic impurities and said doping impurities of said second type comprise boron or boronfluride ($BF_2$) impurities.

24. The method of claim 20, wherein said retrograde-wells of said first type formed in said active regions comprise p-type wells formed by implanting doping impurities of said second type and said retrograde-wells of said second type formed in said active regions comprise n-type wells formed by implanting doping impurities of said first type.

25. The method of claim 20, wherein said semiconductor device structures of said first conductivity type are n-channel MOSFETs and said semiconductor device structures of said second conductivity type are p-channel MOSFETs.

26. The method of claim 20, wherein said dielectric spacers formed on sidewalls of said gate regions and said gate interconnections comprise silicon-nitride as deposited by using LPCVD.

27. The method of claim 20, wherein said conductive semiconductor film comprises a polycrystalline-silicon film or an amorphous-silicon film as deposited by LPCVD.

28. The method of claim 20, wherein said refractory metal film deposited to form self-aligned silicidation comprises titanium or cobalt as deposited by sputtering or LPCVD.

29. The method of claim 20, wherein said self-aligned silicidation of said remained and patterned conductive semiconductor films is used to reduce interconnection resistances of said heavily-doped source/drain regions of said semiconductor device structures of same conductivity type or different conductivity types.

30. The method of claim 20, wherein said interlayer dielectric film comprises an oxide film or a doped-oxide film, as deposited by high-density plasma CVD or CVD.

31. The method of claim 20, wherein said barrier-metal layer deposited over said formed structure having said contact holes over said trench-isolation regions comprises a titanium-nitride film as deposited by sputtering or CVD.

32. The method of claim 20, wherein said plug-metal film deposited to fill up said contact holes over said trench-isolation regions comprises a tungsten film as deposited by sputtering or CVD.

33. The method of claim 20, wherein said first-level interconnection metal film deposited comprises a copper-aluminum alloy firm over a barrier-metal layer or a copper film over a barrier-metal layer or an aluminum film over a barrier-metal layer.

34. The method of claim 20, wherein said shallow-trench-isolation structure for said semiconductor device structures of two conductivity types using said first multilayer masking structure having a masking silicon-nitride layer formed over a pad-oxide layer and further comprising the steps of:

forming said pad-oxide layer over said semiconductor substrate and then depositing said masking silicon-nitride layer over said pad-oxide layer to form said first multilayer masking structure;

patterning said first multilayer masking structure using a patterned masking photoresist PR1 and then selectively removing said masking silicon-nitride layer and said pad-oxide layer using anisotropic dry etching to form active regions for said semiconductor device structures, followed by stripping said patterned masking photoresist PR1;

forming oxide spacers on sidewalls of said patterned first multilayer masking structure by first depositing a conformable silicon-oxide layer using LPCVD followed by etching back said conformable silicon-oxide layer;

etching exposed semiconductor substrate in a self-aligned manner to form shallow trenches using said patterned first multilayer masking structures and said oxide spacers as a hard etching mask;

oxidizing semiconductor surfaces of said shallow trenches to form oxide layers for eliminating the trench etching-induced defects;

performing field-encroachment implant using doping impurities of a second type to form implanted regions under said oxide layers over said shallow trenches;

filling up gaps formed by said shallow trenches and said patterned first multilayer masking structure with a trench field-oxide film and planarizing a formed structure surface using CMP and using said masking silicon-nitride layer as a polishing stop;

etching back a planarized structure in a self-aligned manner to etch said trench field-oxide film and said oxide spacers simultaneously to a depth smaller than a thickness of said masking silicon-nitride layer to form said first shallow-trench-isolation structure;

removing said marking silicon-nitride layer using wet-chemical etching or anisotropic dry etching;

implanting doping impurities of a second type across said pad-oxide layer and remained oxide-spacers into said semiconductor substrate to form retrograde-wells of a first type and then implanting doping impurities of said second type across said pad-oxide layers and said remained oxide-spacers into said retrograde-wells of said first type to perform threshold-voltage adjustment and to form punch-through stops for said semiconductor device structures of said first conductivity type using a patterned masking photoresist PR2A and then stripping sad patterned masking photoresist PR2A;

implanting doping impurities of a first type across said pad-oxide layer and said remained oxide-spacers into said semiconductor substrate to form said retrograde-wells of said second type and then implanting doping impurities of said second, type across said pad-oxide layers and said remained oxide-spacers into said retrograde-wells of said second type to perform said threshold-voltage adjustment and implanting doping impurities of said first type to form said punch-through stops for said semiconductor device structures of said second conductivity type by using a patterned masking photoresist PR2B and then stripping said patterned masking photoresist PR2B;

removing said pad-oxide layers and simultaneously etching said remained oxide-spacers and remained trench field-oxide films using wet-chemical etching or anisotropic dry etching;

oxidizing exposed semiconductor surfaces to grow a gate-dielectric layer; and depositing a silicide layer over a doped polycrystalline-silicon layer or a doped amorphous-silicon layer to form a highly-conductive gate layer.

35. The method of claim 34, wherein said doped polycrystalline-silicon layer or said doped amorphous-silicon layer in said highly-conductive gate layer comprises an in-situ doped polycrystalline-silicon layer or an in-situ doped amorphous-silicon layer, as deposited by LPCVD, or is doped by implanting doping impurities of said first type for said semiconductor device structures of said first conductivity type using one patterned masking photoresist and implanting doping impurities of said second type for said semiconductor device structures of said second conductivity type using another patterned masking photoresist having a mask of reverse tone.

36. The method of claim 20, wherein said shallow-trench-isolation structure for said semiconductor devices of two conductivity types using said second multilayer masking structure having a masking silicon-nitride layer formed over a conductive semiconductor layer on said gate-dielectric layer and further comprising the steps of:

forming a sacrificial-oxide layer over said semiconductor substrate;

implanting doping impurities of a second type across said sacrificial-oxide layer into said semiconductor substrate to form retrograde-wells of a first type and then implanting doping impurities of said second type across said sacrificial-oxide layer into said retrograde-wells of said first type to perform threshold-voltage adjustment and to form punch-through stops for said semiconductor device structures of said first conductivity type by using a patterned masking photoresist PRIA and then stripping said patterned masking photoresist PRIA;

implanting doping impurities of a first type across said sacrificial-oxide layer into said semiconductor substrate to form said retrograde-wells of a second type and then implanting doping impurities of said second type to perform said threshold-voltage adjustment and implanting doping impurities of said first type across said sacrificial-oxide layer into said retrograde-wells of said second type to form said punch-through stops for said semiconductor device structures of said second conductivity type by using a patterned masking photoresist PRIB and then stripping said patterned masking photoresist PRIB;

removing said sacrificial-oxide layer on said retrograde-wells over said semiconductor substrate and then growing a gate-dielectric layer on said retrograde-wells over said semiconductor substrate;

depositing said conductive semiconductor layer using LPCVD and then depositing said masking silicon-nitride layer over said conductive semiconductor layer using LPCVD to form a second multilayer masking structure;

patterning said second multilayer masking structure using a patterned masking photoresist PR2 and then selectively removing said masking silicon-nitride layer and said conductive semiconductor layer and said gate-dielectric layer using anisotropic dry etching to form said active regions for said semiconductor device structures, followed by stripping said patterned masking photoresist PR2;, forming oxide spacers on sidewalls of a patterned second multilayer masking structure by first depositing a conformable silicon-oxide layer using LPCVD followed by etching back said conformable silicon-oxide layer;

etching exposed semiconductor surface in a self-aligned manner to form shallow trenches using said patterned second multilayer masking structure and said oxide spacers as a hard etching mask;

oxidizing semiconductor surfaces of said shallow trenches to form oxide layers for eliminating trench etching-induced defects;

performing field-encroachment implant using doping impurities of said second type to form implanted regions under said oxide layers over said shallow trenches;

filling up gaps formed by said shallow trenches and said patterned second multilayer masking structure with a trench field-oxide film and planarizing a formed structure surface using CMP and using said masking silicon-nitride layer as a polishing stop;

etching back a planarized structure in a self-aligned manner to etch said trench field-oxide film and said oxide spacers to a depth larger than a thickness of said masking silicon-nitride layer for said second shallow-trench-isolation structure;

removing said masking silicon-nitride layer using wet-chemical etching or anisotropic dry etching; and depositing a silicided conductive gate layer over said conductive semiconductor layer to form a highly-conductive gate layer.

37. The method of claim 36, wherein said conductive semiconductor layer comprises a polycrystalline-silicon or amorphous-silicon layer and said silicided conductive gate layer comprises a silicide layer over a polycrystalline-silicon layer or a silicide layer over an amorphous-silicon layer.

38. The method of claim 37, wherein said polycrystalline-silicon layer or said amorphous-silicon layer comprises in-situ doped using doping impurities of the same type or is doped by implanting doping impurities of said first type for said semiconductor device structures of said first conductivity type using one patterned masking photoresist and implanting doping impurities of said second type for said semiconductor devices of said second conductivity type using another patterned masking photoresist having a mask of reverse tone.

* * * * *